United States Patent
Pan et al.

(10) Patent No.: US 11,934,216 B2
(45) Date of Patent: Mar. 19, 2024

(54) CONSTANT CURRENT GENERATION CIRCUIT FOR OPTOCOUPLER ISOLATION AMPLIFIER AND CURRENT PRECISION ADJUSTMENT METHOD

(71) Applicant: Hefei AICHUANGWEI Electronic Technology Co., Ltd., Hefei (CN)

(72) Inventors: Jun Pan, Hefei (CN); Lei Qiu, Hefei (CN); Dianwu Li, Hefei (CN); Fenfen Ji, Hefei (CN); Wei Wang, Hefei (CN); Lei Han, Hefei (CN); Ke Wang, Hefei (CN)

(73) Assignee: Hefei AICHUANGWEI Electronic Technology Co., Ltd. (CN)

( * ) Notice: Subject to any disclaimer, the term of this patent is extended or adjusted under 35 U.S.C. 154(b) by 265 days.

(21) Appl. No.: 17/491,087

(22) Filed: Sep. 30, 2021

(65) Prior Publication Data

US 2022/0236755 A1 Jul. 28, 2022

(30) Foreign Application Priority Data

Jan. 25, 2021 (CN) .......................... 202110099542.9

(51) Int. Cl.
*G05F 1/56* (2006.01)
*G05F 1/567* (2006.01)
(Continued)

(52) U.S. Cl.
CPC ................ *G05F 1/567* (2013.01); *G05F 3/30* (2013.01); *H03F 1/302* (2013.01); *H03F 3/085* (2013.01);
(Continued)

(58) Field of Classification Search
CPC . G05F 1/46; G05F 1/462; G05F 1/463; G05F 1/56; G05F 1/561; G05F 1/567;
(Continued)

(56) References Cited

U.S. PATENT DOCUMENTS

| | | | |
|---|---|---|---|
| 7,791,401 B1* | 9/2010 | Chiu .................. | H03F 3/45596 330/261 |
| 2004/0095187 A1* | 5/2004 | Li ........................... | G05F 3/265 327/539 |

(Continued)

FOREIGN PATENT DOCUMENTS

CN 111880600 A * 11/2020 ............. G05F 1/567

*Primary Examiner* — Thienvu V Tran
*Assistant Examiner* — Shahzeb K Ahmad
(74) *Attorney, Agent, or Firm* — James W. Huffman; Huffman Law Group, PC

(57) ABSTRACT

A constant current generation circuit for optocoupler isolation amplifier and a current precision adjustment method are provided. The constant current generation circuit includes a start circuit, a current generation circuit and a precision adjustment and output circuit integrated into a same substrate. The start circuit can generate and output a first start current and a second start current. The current generation circuit includes a negative temperature change rate current generation circuit connected to a first start current output and a positive temperature change rate current generation circuit connected to a second start current output. The precision adjustment and output circuit outputs constant current meeting application requirements of optocoupler isolation amplifier by adjusting proportional precision of two currents output from a current generation circuit.

12 Claims, 2 Drawing Sheets

(51) Int. Cl.
*G05F 3/30* (2006.01)
*H03F 1/30* (2006.01)
*H03F 3/08* (2006.01)
*H03F 3/343* (2006.01)
*H03K 17/78* (2006.01)

(52) U.S. Cl.
CPC ........... *H03F 3/3432* (2013.01); *H03K 17/78* (2013.01); *H03F 2200/447* (2013.01); *H03F 2200/91* (2013.01)

(58) Field of Classification Search
CPC . G05F 3/22; G05F 3/222; G05F 3/225; G05F 3/30; G05F 3/24; G05F 3/242; H03F 1/302; H03F 3/085; H03F 3/3432; H03F 2200/91; H03K 3/082; H03K 17/78
See application file for complete search history.

(56) References Cited

U.S. PATENT DOCUMENTS

| | | | |
|---|---|---|---|
| 2009/0121698 A1* | 5/2009 | Harvey | G05F 3/30 327/539 |
| 2010/0141344 A1* | 6/2010 | Kim | G05F 3/30 330/289 |
| 2011/0241646 A1* | 10/2011 | Vyne | G05F 3/30 323/313 |
| 2019/0025868 A1* | 1/2019 | Segarra | G05F 3/30 |
| 2020/0036366 A1* | 1/2020 | Gupta | G05F 1/567 |
| 2022/0075405 A1* | 3/2022 | Marinca | G05F 3/30 |

* cited by examiner

CONSTANT CURRENT GENERATION CIRCUIT FOR OPTOCOUPLER ISOLATION AMPLIFIER AND CURRENT PRECISION ADJUSTMENT METHOD

CROSS REFERENCE TO RELATED APPLICATION(S)

This patent application claims the benefit and priority of Chinese Patent Application No. 202110099542.9 filed on Jan. 25, 2021, the disclosure of which is incorporated by reference herein in its entirety as part of the present application.

TECHNICAL FIELD

The present disclosure relates to the technical field of designs of semiconductor integrated circuits, and in particular to a constant current generation circuit for an optocoupler isolation amplifier and a current precision adjustment method.

BACKGROUND ART

An optocoupler isolation amplifier circuit, especially one belonging to the field of designs of semiconductor integrated circuits, requires a high-performance constant current to complete biasing and output. In addition, the magnitude of current is required to be within an expected precision range; and the magnitude of current is independent of temperature changes, power supply voltage changes, change in process parameters of current sheets, etc.

SUMMARY

An object of the present disclosure is to provide a constant current generation circuit in an optocoupler isolation amplifier and a current precision adjusting method. The constant current generation circuit provides a high-performance output constant current source which is independent of temperature changes, power supply voltage changes, changes in technological parameters of current sheets, etc.

To achieve the above object, the present disclosure adopts the following technical solution:

A constant current generation circuit for an optocoupler isolation amplifier includes a start circuit, a current generation circuit and a precision adjustment and output circuit which are integrated into a same substrate, where the start circuit can generate and output a first start current and a second start current;

the current generation circuit includes a negative temperature change rate current generation circuit and a positive temperature change rate current generation circuit, where the negative temperature change rate current generation circuit is connected with a first start current output end; the positive temperature change rate current generation circuit is connected with a second start current output end; and the precision adjustment and output circuit is used for outputting a constant current meeting application requirements of the optocoupler isolation amplifier by adjusting proportional precision of two currents outputted from the current generation circuit.

Further, the start circuit includes a diode D1, a resistor R1 and a diode D2 which are connected with a power supply in sequence, where an anode of the diode D1 is connected with an output end of the power supply, and a cathode is connected with one end of the resistor R1; another end of the resistor R1 is connected with a cathode of the diode D2; and the first start current output end and the second start current output end are lead led out from an anode of the diode D2 via resistors R2 and R3, respectively.

Preferably, the negative temperature change rate current generation circuit (21) comprises triodes Q1, Q2, Q3 and Q4 connected with each other, wherein a drain of the triode Q1 is connected with the resistor R2 and a gate of the triode Q1; a source of the triode Q1 is connected with a drain of the triode Q2 and a gate of the triode Q3; a source of the triode Q2 is grounded and connected with a source of the triode Q3 via a resistor R4; a gate of the triode Q2 is connected with a source of the triode Q4; a drain of the triode Q3 is connected with the source of the triode Q4; a gate of the triode Q4 is connected with the gate of the triode Q1; and a drain of the triode Q4 is connected with an input end of the precision adjustment and output circuit.

Preferably, the positive temperature change rate current generation circuit (22) comprises triodes Q5, Q6, Q7 and Q8 connected with each other, wherein a drain of the triode Q5 is connected with the resistor R3 and a gate of the triode Q5; a source of the triode Q5 is connected with a drain of the triode Q6 and a gate of the triode Q7; a source of the triode Q6 is connected with a position between the triode Q2 and a resistor R4 and connected with a source of the triode Q7 via a resistor R5; a gate of the triode Q6 is connected with a source of the triode Q8; a drain of the triode Q7 is connected with the source of the triode Q8; a gate of the triode Q8 is connected with the gate of the triode Q5; and a drain of the triode Q8 is connected with the input end of the precision adjustment and output circuit.

Further, the precision adjustment and output circuit (3) comprises triodes Q9 and Q10, wherein a source of the triode Q9 is connected with the output end of the power supply and a source of the triode Q10; a drain of the triode Q9 is connected with an output end of the current generation circuit and a gate of the triode Q9; the gate of the triode Q9 is connected with a gate of the triode Q10; and the drain of the triode Q10 is a constant current output end.

Further, the resistors R4 and R5 are ion implanted type resistors applied to a semiconductor integrated circuit technology; the resistor R4 has a higher temperature coefficient than a thermal voltage of the semiconductor integrated circuit technology; and the resistor R5 has a lower temperature coefficient than the thermal voltage of the semiconductor integrated circuit technology.

A precision adjustment method for a constant current generation circuit for an optocoupler isolation amplifier includes the following steps of:

step 1, calculating a current outputted by the current generation circuit, where a calculation formula of the current is as follows:

$$TC_{I_3} = \frac{I_1}{I_1+I_2} \times (TCv_t - TC_{R_4}) + \frac{I_1}{I_1+I_2} \times (TCv_t - TC_{R_5})$$

where $I_1$ represents an output current of the negative temperature coefficient current generation circuit; $I_2$ represents an output current of the positive temperature coefficient current generation circuit; $I_3$ represents an output current of the current generation circuit; $TC_{I_3}$ represents a temperature coefficient of the current $I_3$; $TC_{R_4}$ represents a temperature coefficient of the resistor R4; $TC_{R_5}$ represents a temperature coefficient of the resistor R5; and $TCv_t$ represents a temperature coefficient of the thermal voltage $V_t$ of the semiconductor integrated circuit technology.

step 2, the current $I_3$ passes through a precision adjustment circuit, and a calculation formula of the output current is as follows:

$$I_{OUT} = \frac{A_{Q_9}}{A_{Q_{10}}} \times I_3$$

where $A_{Q_9}$ represents an area of an emission region of the triode Q9, and $A_{Q_{10}}$ represents an area of an emission region of the triode Q10.

According to the above technical solution, the present disclosure combines and integrates the start circuit, the negative temperature change rate current generation circuit, the positive temperature change rate current generation circuit and the precision adjustment and output circuit on a single substrate to form a constant current output circuit which is independent of temperature changes, power supply voltage changes and technological parameter changes of current sheets, thereby obtaining a high-performance output constant current source.

In the figures: 1, start circuit; 21, negative temperature change rate current generation circuit; 22, positive temperature change rate current generation circuit; and 3, precision adjustment and output circuit.

DETAILED DESCRIPTION OF THE EMBODIMENTS

A preferred embodiment of the present disclosure is described in detail below with reference to the accompanying drawings.

Figure 1:
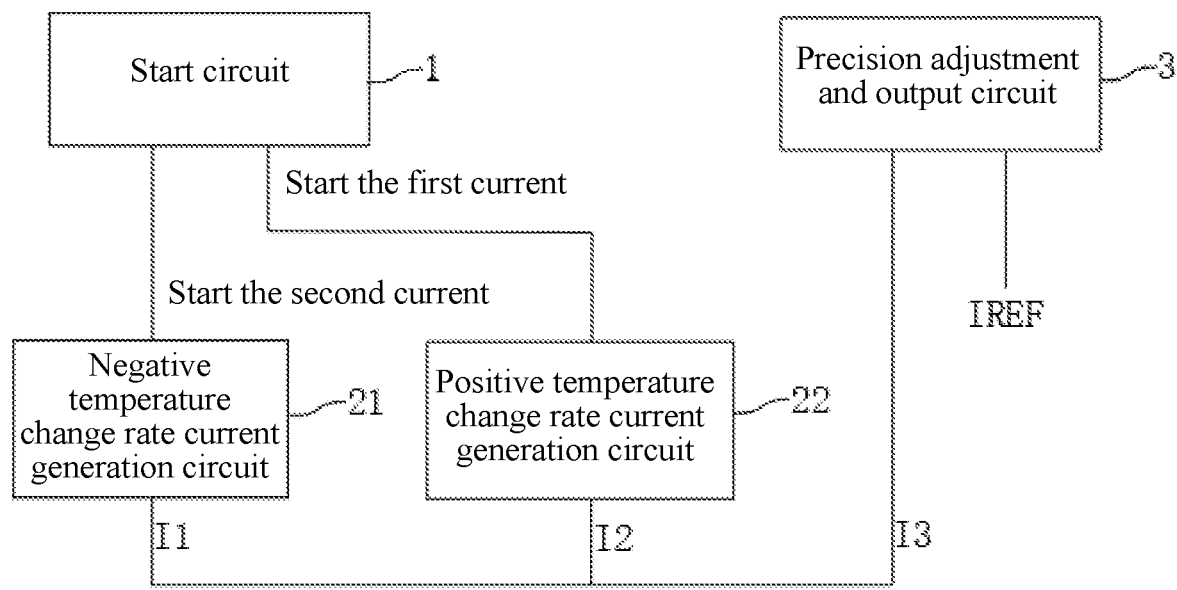
FIG. 1 is a schematic diagram of an overall structure in accordance with the present disclosure.
Figure 2:
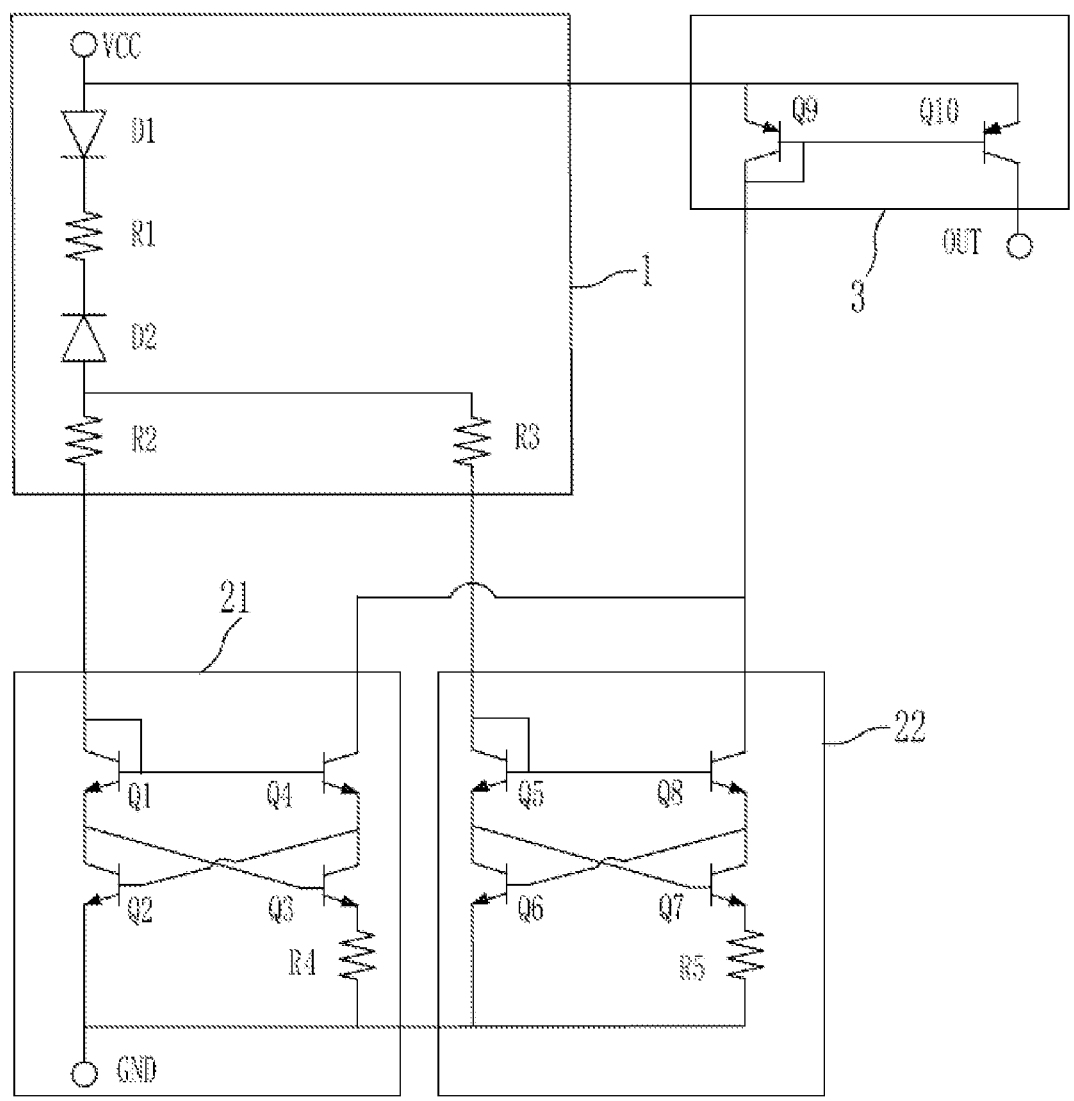
FIG. 2 is a schematic diagram showing circuit connection in accordance with the present disclosure.

As shown in FIG. 1 and FIG. 2, the constant current generation circuit for an optocoupler isolation amplifier includes a start circuit 1, a current generation circuit and a precision adjustment and output circuit 3 which are integrated into a same substrate, where the start circuit can generate and output a first start current and a second start current; the current generation circuit includes a negative temperature change rate current generation circuit 21 and a positive temperature change rate current generation circuit 22. Further, the negative temperature change rate current generation circuit is connected with a first start current output end, and the positive temperature change rate current generation circuit is connected with a second start current output end. The precision adjustment and output circuit is used for outputting a constant current meeting application requirements of the optocoupler isolation amplifier by adjusting proportional precision of two currents outputted by the current generation circuit.

According to the present disclosure, a high-performance constant current source output circuit is achieved by utilizing inherent devices of a semiconductor integrated circuit technology based on the same substrate. The negative temperature change rate current generation circuit 21 can generate a current $I_1$ which is independent of changes in power supply voltage but related to temperature changes and changes in technological parameter of current sheets, and the current $I_1$ is inversely proportional to temperature changes. Similarly, the positive temperature change rate current generation circuit 22 can generate a current $I_2$ which is independent of changes in power supply voltage but related to temperature changes and changes in technological parameter of current sheets, and the current $I_2$ is proportional to temperature changes.

Specifically, the start circuit of the preferred embodiment includes a diode D1, a resistor R1 and a diode D2 which are connected with a power supply in sequence, where an anode of the diode D1 is connected with an output end of the power supply, and a cathode is connected with one end of the resistor R1; the other end of the resistor R1 is connected with a cathode of the diode D2; and a first start current output end and a second start current output end are lead out from an anode of the diode D2 via resistors R2 and R3, respectively.

The negative temperature change rate current generation circuit 21 of the preferred embodiment includes triodes Q1, Q2, Q3 and Q4 connected with each other, where a drain of the triode Q1 is connected with the resistor R2 and a gate of the triode Q1; a source of the triode Q1 is connected with a drain of the triode Q2 and a gate of the triode Q3; a source of the triode Q2 is grounded and connected with a source of the triode Q3 via the resistor R4; a gate of the triode Q2 is connected with a source of the triode Q4; a drain of the triode Q3 is connected with the source of the triode Q4; a gate of the triode Q4 is connected with the gate of the triode Q1; and a drain of the triode Q4 is connected with an input end of the precision adjustment and output circuit.

The positive temperature change rate current generation circuit 22 of the preferred embodiment includes triodes Q5, Q6, Q7 and Q8 connected with each other, where a drain of the triode Q5 is connected with the resistor R3 and a gate of the triode Q5; a source of the triode Q5 is connected with a drain of the triode Q6 and a gate of the triode Q7; a source of the triode Q6 is connected with a position between the triode Q2 and a resistor R4 and connected with a source of the triode Q7 via a resistor R5; a gate of the triode Q6 is connected with a source of the triode Q8; a drain of the triode Q7 is connected with the source of the triode Q8; a gate of the triode Q8 is connected with the gate of the triode Q5; and a drain of the triode Q8 is connected with the input end of the precision adjustment and output circuit.

The precision adjustment and output circuit 3 of the preferred embodiment includes triodes Q9 and Q10, where a source of the triode Q9 is connected with the output end of the power supply and a source of the triode Q10; a drain of the triode Q9 is connected with an output end of the current generation circuit and a gate of the triode Q9; the gate of the triode Q9 is connected with a gate of the triode Q10; and the drain of the triode Q10 is a constant current output end.

Particularly, all the above triodes have a current magnification factor far greater than 1; the resistors R1, R2, R3 and R4 are all ion implanted type resistors applied to the semiconductor integrated circuit technology; the resistor R5 is a diffusion implanted type resistor applied to the semiconductor integrated circuit technology; the resistor R4 has a higher temperature coefficient than a thermal voltage of the semiconductor integrated circuit technology; and the resistor R5 has a lower temperature coefficient than the thermal voltage of the semiconductor integrated circuit technology.

A precision adjustment method for the constant current generation circuit for an optocoupler isolation amplifier of the present disclosure includes the following steps of:

Step 1, calculating a current outputted by the current generation circuit, where a calculation formula of the current is as follows:

$$TC_{I_3} = \frac{I_1}{I_1+I_2} \times (TCv_t - TC_{R_4}) + \frac{I_1}{I_1+I_2} \times (TCv_t - TC_{R_5})$$

where $I_1$ represents an output current of the negative temperature coefficient current generation circuit; $I_2$ represents an output current of the positive temperature coefficient current generation circuit; $I_3$ represents an output current of the current generation circuit; $TC_{R_4}$ represents a temperature coefficient of the resistor R4; $TC_{R_5}$ represents a temperature coefficient of the resistor R5; and $TCv_t$ represents a temperature coefficient of the thermal voltage $V_t$ of the semiconductor integrated circuit technology.

Specifically, it can be seen from the above description that a temperature change rate characteristic of the resistor R4 satisfies $TC_{I_1}=TCv_t-TC_{R_1}<0$; a temperature change rate characteristic of the resistor R5 satisfies $TC_{I_2}=TCv_t-TC_{R_2}>0$; in other words, the current $I_1$ decreases with rise of the temperature, and the current $I_2$ rises with rise of the temperature; a reasonable ratio of the current $I_1$ to the current $I_2$ is set through the above calculation formula, and finally the temperature coefficient $TC_{I_3}$ of the current $I_3$ is zero, and as a result, the magnitude of the current $I_3$ is independent of temperature changes, and the magnitude of current $I_3$ is also not affected by changes of the power supply voltage $V_{CC}$.

Step 2, in order to make the output current $I_{OUT}$ meet application precision requirements of an optocoupler isolation amplifier circuit, the above current $I_3$ should be adjusted reasonably. The current $I_3$ is inputted into the precision adjustment and output circuit, and the triode Q9 and triode Q10 in the precision adjustment and output circuit form a current mirror relationship, that is, an output current $I_{OUT}$ of the precision adjustment and output circuit is proportional to an input current $I_3$ of the precision adjustment and output circuit. Therefore, the current $I_3$ passes through a precision adjustment circuit, and a calculation formula of the output current is as follows:

$$I_{OUT} = \frac{A_{Q_9}}{A_{Q_{10}}} \times I_3$$

where $A_{Q_9}$ represents an area of an emission region of the triode Q9, and $A_{Q_{10}}$ represents an area of an emission region of the triode Q10.

The above formula shows that the output current $I_{OUT}$ of the precision adjustment and output circuit can be adjusted to an expected precision range by reasonably adjusting a ratio of the area of emission region of the triode Q9 to the area of emission region of the triode Q10. Since the aforementioned current $I_3$ is not affected by changes of the power supply voltage $V_{CC}$, the output current $I_{OUT}$ is also not affected by changes of power supply voltage $V_{CC}$. Moreover, since the output current $I_{OUT}$ has the same temperature coefficient as the aforementioned current $I_3$, and both are zero, changes of the output current $I_{OUT}$ are independent of temperature changes as well, and thus the output of a high-performance constant current source is achieved.

The above embodiments are merely intended to describe the preferred embodiments of the present disclosure rather than to limit the scope of the present disclosure. Various alterations and improvements made by those of ordinary skill in the art based on the technical solution of the present disclosure without departing from the design spirit of the present disclosure shall fall within the protection scope of the claims of the present disclosure.

What is claimed is:

1. A constant current generation circuit for an optocoupler isolation amplifier, comprising a start circuit (1), a current generation circuit and a precision adjustment and output circuit (3) which are integrated into a same substrate, wherein the start circuit (1) can generate and output a first start current and a second start current;
the current generation circuit comprises a negative temperature change rate current generation circuit (21) and a positive temperature change rate current generation circuit (22), wherein the negative temperature change rate current generation circuit (21) is connected with a first start current output end; the positive temperature change rate current generation circuit (22) is connected with a second start current output end; and
the precision adjustment and output circuit (3) is used for outputting a constant current meeting application requirements of the optocoupler isolation amplifier by adjusting proportional precision of two currents outputted from the current generation circuit, wherein the start circuit (1) comprises a diode D1, a resistor R1 and a diode D2 which are connected with a power supply in sequence, wherein an anode of the diode D1 is connected with an output end of the power supply, and a cathode is connected with one end of the resistor R1; another end of the resistor R1 is connected with a cathode of the diode D2; and the first start current output end and the second start current output end are led out from an anode of the diode D2 via resistors R2 and R3, respectively.

2. The constant current generation circuit according to claim 1, wherein the negative temperature change rate current generation circuit (21) comprises triodes Q1, Q2, Q3 and Q4 connected with each other, wherein a drain of the triode Q1 is connected with the resistor R2 and a gate of the triode Q1; a source of the triode Q1 is connected with a drain of the triode Q2 and a gate of the triode Q3; a source of the triode Q2 is grounded and connected with a source of the triode Q3 via a resistor R4; a gate of the triode Q2 is connected with a source of the triode Q4; a drain of the triode Q3 is connected with the source of the triode Q4; a gate of the triode Q4 is connected with the gate of the triode Q1; and a drain of the triode Q4 is connected with an input end of the precision adjustment and output circuit.

3. The constant current generation circuit according to claim 2, wherein the resistors R1, R2, R3 and R4 are all ion implanted type resistors applied to a semiconductor integrated circuit technology; the resistor R5 is a diffusion implanted type resistor applied to the semiconductor integrated circuit technology; the resistor R4 has a higher temperature coefficient than a thermal voltage of the semiconductor integrated circuit technology; and the resistor R5 has a lower temperature coefficient than the thermal voltage of the semiconductor integrated circuit technology.

4. The constant current generation circuit according to claim 1, wherein the positive temperature change rate current generation circuit (22) comprises triodes Q5, Q6, Q7 and Q8 connected with each other, wherein a drain of the triode Q5 is connected with the resistor R3 and a gate of the triode Q5; a source of the triode Q5 is connected with a drain of the triode Q6 and a gate of the triode Q7; a source of the triode Q6 is connected with a position between the triode Q2 and a resistor R4 and connected with a source of the triode Q7 via a resistor R5; a gate of the triode Q6 is connected with a source of the triode Q8; a drain of the triode Q7 is connected with the source of the triode Q8; a gate of the triode Q8 is connected with the gate of the triode Q5; and a drain of the triode Q8 is connected with the input end of the precision adjustment and output circuit.

5. The constant current generation circuit according to claim 4, wherein the resistors R1, R2, R3 and R4 are all ion implanted type resistors applied to a semiconductor integrated circuit technology; the resistor R5 is a diffusion implanted type resistor applied to the semiconductor integrated circuit technology; the resistor R4 has a higher temperature coefficient than a thermal voltage of the semiconductor integrated circuit technology; and the resistor R5 has a lower temperature coefficient than the thermal voltage of the semiconductor integrated circuit technology.

6. The constant current generation circuit according to claim 1, wherein the precision adjustment and output circuit (3) comprises triodes Q9 and Q10, wherein a source of the triode Q9 is connected with the output end of the power supply and a source of the triode Q10; a drain of the triode Q9 is connected with an output end of the current generation circuit and a gate of the triode Q9; the gate of the triode Q9 is connected with a gate of the triode Q10; and the drain of the triode Q10 is a constant current output end.

7. A precision adjustment method for the constant current generation circuit according to claim 1, comprising the following steps of:
step 1, calculating a current outputted by the current generation circuit, wherein a calculation formula of the current is as follows:

$$TC_{I_3} = \frac{I_1}{I_1 + I_2} \times (TCv_t - TC_{R_4}) + \frac{I_1}{I_1 + I_2} \times (TCv_t - TC_{R_5})$$

wherein $I_1$ represents an output current of a negative temperature coefficient current generation circuit; $I_2$ represents an output current of a positive temperature coefficient current generation circuit; $I_3$ represents an output current of the current generation circuit; $TC_{I_3}$ represents a temperature coefficient of the current $I_3$; $TC_{R_4}$ represents a temperature coefficient of a resistor R4; $TC_{R_5}$ represents a temperature coefficient of a resistor R5; and $TCv_t$ represents a temperature coefficient of a thermal voltage $V_t$ of a semiconductor integrated circuit technology;
step 2, the current $I_3$ passes through a precision adjustment circuit, and a calculation formula of the output current is as follows:

$$I_{OUT} = \frac{A_{Q_9}}{A_{Q_{10}}} \times I_3$$

wherein $A_{Q_9}$ represents an area of an emission region of a triode Q9, and $A_{Q_{10}}$ represents an area of an emission region of a triode Q10.

8. The precision adjustment method according to claim 7, wherein the negative temperature change rate current generation circuit (21) comprises triodes Q1, Q2, Q3 and Q4 connected with each other, wherein a drain of the triode Q1 is connected with the resistor R2 and a gate of the triode Q1; a source of the triode Q1 is connected with a drain of the triode Q2 and a gate of the triode Q3; a source of the triode Q2 is grounded and connected with a source of the triode Q3 via a resistor R4; a gate of the triode Q2 is connected with a source of the triode Q4; a drain of the triode Q3 is connected with the source of the triode Q4; a gate of the triode Q4 is connected with the gate of the triode Q1; and a drain of the triode Q4 is connected with an input end of the precision adjustment and output circuit.

9. The precision adjustment method according to claim 8, wherein the resistors R1, R2, R3 and R4 are all ion implanted type resistors applied to a semiconductor integrated circuit technology; the resistor R5 is a diffusion implanted type resistor applied to the semiconductor integrated circuit technology; the resistor R4 has a higher temperature coefficient than a thermal voltage of the semiconductor integrated circuit technology; and the resistor R5 has a lower temperature coefficient than the thermal voltage of the semiconductor integrated circuit technology.

10. The precision adjustment method according to claim 7, wherein the positive temperature change rate current generation circuit (22) comprises triodes Q5, Q6, Q7 and Q8 connected with each other, wherein a drain of the triode Q5 is connected with the resistor R3 and a gate of the triode Q5; a source of the triode Q5 is connected with a drain of the triode Q6 and a gate of the triode Q7; a source of the triode Q6 is connected with a position between the triode Q2 and a resistor R4 and connected with a source of the triode Q7 via a resistor R5; a gate of the triode Q6 is connected with a source of the triode Q8; a drain of the triode Q7 is connected with the source of the triode Q8; a gate of the triode Q8 is connected with the gate of the triode Q5; and a drain of the triode Q8 is connected with the input end of the precision adjustment and output circuit.

11. The precision adjustment method according to claim 10, wherein the resistors R1, R2, R3 and R4 are all ion implanted type resistors applied to a semiconductor integrated circuit technology; the resistor R5 is a diffusion implanted type resistor applied to the semiconductor integrated circuit technology; the resistor R4 has a higher temperature coefficient than a thermal voltage of the semiconductor integrated circuit technology; and the resistor R5 has a lower temperature coefficient than the thermal voltage of the semiconductor integrated circuit technology.

12. The precision adjustment method according to claim 7, wherein the precision adjustment and output circuit (3) comprises triodes Q9 and Q10, wherein a source of the triode Q9 is connected with the output end of the power supply and a source of the triode Q10; a drain of the triode Q9 is connected with an output end of the current generation circuit and a gate of the triode Q9; the gate of the triode Q9 is connected with a gate of the triode Q10; and the drain of the triode Q10 is a constant current output end.

* * * * *